United States Patent [19]

Macomber

[11] Patent Number: 5,282,220

[45] Date of Patent: Jan. 25, 1994

[54] TALBOT FILTERED SURFACE EMITTING DISTRIBUTED FEEDBACK SEMICONDUCTOR LASER ARRAY

[75] Inventor: Steven H. Macomber, Bethel, Conn.

[73] Assignee: Hughes Aircraft Company, Los Angeles, Calif.

[21] Appl. No.: 873,314

[22] Filed: Apr. 24, 1992

[51] Int. Cl.⁵ .................. H01S 3/10; H01S 3/19
[52] U.S. Cl. ........................... 372/96; 372/50
[58] Field of Search ............. 372/108, 50, 96, 92

[56] References Cited

U.S. PATENT DOCUMENTS 4,985,897  1/1991  Botez et al. ..................... 372/50

*Primary Examiner*—James W. Davie
*Attorney, Agent, or Firm*—Michael W. Sales; Wanda K. Denson-Low

[57] ABSTRACT

A Talbot filtered surface emitting distributed feedback semiconductor laser array (12) includes two surface emitting distributed feedback semiconductor laser device subarrays (20, 22) that are separated by a free propagation region (24) having a length equal to a Talbot distance, $z_T$. Within each subarray (20, 22) there is a like number of surface emitting distributed feedback semiconductor laser device elements (18) that are laterally isolated from each other by optical absorbing material stripes (26) to prevent evanescent coupling. A Talbot spatial filter array (28) of optical absorbing material islands (34) is fabricated in the free propagation region (24) at one half the Talbot distance. The Talbot spatial filter array (28) establishes fundamental lateral mode oscillation in the array (12), thereby producing a high quality laser beam with a predominantly single lobed far-field.

16 Claims, 5 Drawing Sheets

TALBOT FILTERED SURFACE EMITTING DISTRIBUTED FEEDBACK SEMICONDUCTOR LASER ARRAY

BACKGROUND OF THE INVENTION

1. Field of the Invention

The present invention relates to surface emitting distributed feedback semiconductor lasers and, more particularly, to a surface emitting distributed feedback semiconductor laser array that uses a Talbot spatial filter to establish fundamental lateral mode oscillation.

2. Description of the Prior Art

Light amplification by the stimulated emission of radiation (laser) produces unidirectional, monochromatic, and most importantly coherent visible light. The stimulated emission of radiation is a process in which the energy state of an atom changes in a quantum transition with the emission of a photon. During such a process, a photon approaches an atom, initially in an excited energy state, and induces this atom to make a transition to a lower energy state. As the atom's energy state is lowered, the atom emits a photon. This emitted photon, which is separate from the photon that induced the energy transition, possesses an energy that is equal to the difference between the excited and the lower energy states of the atom. Moreover, this emitted photon and the inducing photon both leave the atom in the same direction the inducing photon had as it approached the atom. These exiting photons are also exactly in relative phase with one another; that is, they are coherent. This coherence is dictated by energy conservation in that if the two photons were out of phase by any amount they would interfere destructively, thereby violating energy conservation. Therefore, stimulated emission of radiation is a process that induces coherent photon multiplication or light amplification, thus a laser.

Laser technology has evolved by applying the above stated principle to several different types of active media. The most recent development in this field, coupled with the advancements in semiconductor fabrication technology, is the semiconductor laser. Unlike an atomic laser, however, stimulated emission in a semiconductor laser occurs when there is a solid state material in an excited state. Thus, stimulated emission in a semiconductor laser involves more than one atom.

A surface emitting distributed feedback semiconductor laser is a device that produces unidirectional, monochromatic, coherent visible light through stimulated emission in semiconductor materials. Such a device has a positively doped side and a negatively doped side that are joined at a junction, and a grating surface that is etched into an outer surface of the positively doped side. The grating surface, upon which a strong conductive material is deposited, provides a means by which coherent photon energy fields may be diffracted. A second order grating design permits deflections of coherent photon radiation to be directed normal to an output window etched into the negatively doped side of the junction through first order diffraction, and directed parallel to the grating surface through second order diffraction. The first order diffraction produces a beam of unidirectional, monochromatic, coherent visible light at the output window, whereas the second order diffraction provides a feedback of photon radiation to an active region that is adjacent and parallel to the grating surface.

A theoretical longitudinal mode near-field intensity profile produced at the output window of a surface emitting distributed feedback semiconductor laser device is antisymmetric with a zero intensity null at the output window center. A corresponding theoretical longitudinal mode far-field intensity profile is double-lobed and symmetric about the output window center. These theoretical intensity profiles have been practically demonstrated in actual single device measurements as described in the article *Surface Emitting Distributed Feedback Semiconductor Laser*, Applied Physics Letters, Volume 51, Number 7, pp. 472-474, August 1987.

The incorporation of a linearly varying chirp in the second order grating design, however, results in more desirable theoretical and practically demonstrated intensity profiles. For instance, the theoretical longitudinal mode near-field intensity profile produced at the output window of a chirped grating surface emitting distributed feedback semiconductor laser device is without an undesirable zero intensity null at the output window center. Furthermore, the corresponding theoretical longitudinal mode far-field intensity profile has a desirable single lobe. These more desirable theoretical intensity profiles have been practically demonstrated in actual single device measurements as described in the related and copending patent application and assigned to the assignee hereof Ser. No. 07/826,720, entitled, Chirped Grating Surface Emitting Distributed Feedback Semiconductor Laser, filed on Jan. 28, 1992. Such measurements have also demonstrated that a single chirped grating surface emitting distributed feedback semiconductor laser device is capable of producing a desirable 350 mW of continuous wave power in a single-lobed far-field at an efficiency of up to 20%. It can thus be inferred from the many desirable characteristics of a single chirped grating surface emitting distributed feedback semiconductor device that there are a wide variety of applications in which one or more of these devices can be used.

SUMMARY OF THE INVENTION

The present invention contemplates a manufacture in which an array of chirped grating surface emitting distributed feedback semiconductor laser devices are used to produce a high quality laser beam with up to 10 watts of continuous wave power in a single-lobed far-field. This manufacture is realized by using a Talbot spatial filter to establish fundamental lateral mode oscillation. It should be noted that a Talbot spatial filter may also be used in an array of non-chirped grating surface emitting distributed feedback semiconductor laser devices, although, as will be discussed, the output beam quality and the overall efficiency of such an array is not as desirable.

The preferred embodiment of the present invention is a manufacture that actually consists of two chirped grating surface emitting distributed feedback semiconductor laser device subarrays that are separated by a free propagation region having a length equal to what is commonly known as a Talbot distance. Within each subarray, there is a like number of parallel positioned chirped grating surface emitting distributed feedback semiconductor laser devices of the type specified in the prior art. These parallel positioned chirped grating surface emitting distributed feedback semiconductor laser devices, or elements, within each subarray are laterally isolated from each other by inter-element "stripes" of an optical absorbing material. The optical absorbing inter-element stripes absorb any lateral out-of-phase waveguide modes, thereby preventing evanescent coupling between subarray elements.

The two subarrays are positioned such that one end of each element in the first subarray is bordering one side of the free propagation region and one end of each element in the second subarray is bordering the other side of the free propagation region. Also, the bordering end of each element in the first subarray is directly in line, or corresponding, with the bordering end of one of the like number of elements in the second subarray. Furthermore, an array of optical absorbing material "islands" are positioned in the center of the free propagation region such that there is one island directly in line with each of the corresponding pairs of intra-subarray elements. These islands act as spatial filters for a particular waveguide mode that exists in each corresponding pair of inter-subarray elements. Since this array of optical absorbing material islands is positioned at the midpoint of the free propagation region, or at the midpoint of the Talbot distance, it is referred to as a Talbot spatial filter.

As previously noted, the Talbot spatial filter is used to establish fundamental lateral mode oscillation. For fundamental lateral mode oscillation to occur, however, there must be parallel coupling between the elements within each subarray and effective filtering of undesirable waveguide modes between each subarray. The Talbot spatial filter satisfies these parallel coupling and undesirable waveguide mode filtering requirements in two ways.

First, the two chirped grating surface emitting distributed feedback semiconductor laser device subarrays are separated by the Talbot distance since, at this distance, a parallel coupling between the elements within each subarray results in only an in-phase waveguide mode and an out-of-phase waveguide mode being well defined. In other words, only well defined Talbot images of an in-phase waveguide mode and an out-of-phase waveguide mode from an original subarray source are formed at the Talbot distance away from the original subarray source. Of these two dominant waveguide modes, however, only the in-phase waveguide mode exhibits a constant phase profile across all of the elements of the original subarray at the Talbot distance. Thus, in the present invention the strongest coupling between the first and the second subarrays occurs when the two subarrays are separated by the Talbot distance (or some multiple thereof) and the two subarrays are in-phase with one another.

Secondly, the dominant out-of-phase waveguide mode that results from parallel coupling between elements within a subarray exhibits an alternating phase profile between every other subarray element. This out-of-phase waveguide mode produces a predominantly double-lobed longitudinal mode far-field intensity profile with no central lobe, whereas the in-phase waveguide mode, with its constant phase profile, produces a predominantly single-lobed longitudinal mode far-field intensity profile. Thus, since it is more desirable to concentrate the power of a laser beam into a single-lobed far-field, the out-of-phase waveguide mode is not desirable and must therefore be filtered.

The out-of-phase waveguide mode is filtered by the optical absorbing material islands of the Talbot spatial filter. This filtering is directly dependent upon the positioning of the Talbot spatial filter islands since, at one half the Talbot distance, the out-of-phase waveguide mode half-plane Talbot images from elements in an original subarray source have maxima directly in line with the original subarray source elements. Thus, the positioning of the Talbot spatial filter islands directly coincides with the out-of-phase waveguide mode half-plane Talbot images, and the out-of-phase waveguide mode is thereby selectively filtered by the Talbot spatial filter. Therefore, the Talbot spatial filter satisfies the requirements for establishing fundamental lateral mode oscillation and the result is a high quality laser beam with a predominantly single-lobed far-field.

The primary objective of the present invention is to provide an array of surface emitting distributed feedback semiconductor laser devices that produces a high quality laser beam with up to 10 Watts of continuous wave power in a single far-field lobe.

Another objective of the present invention is to use a Talbot spatial filter to establish fundamental lateral mode oscillation in an array of surface emitting distributed feedback semiconductor laser devices.

BRIEF DESCRIPTIONS OF THE DRAWINGS

Figure 3:
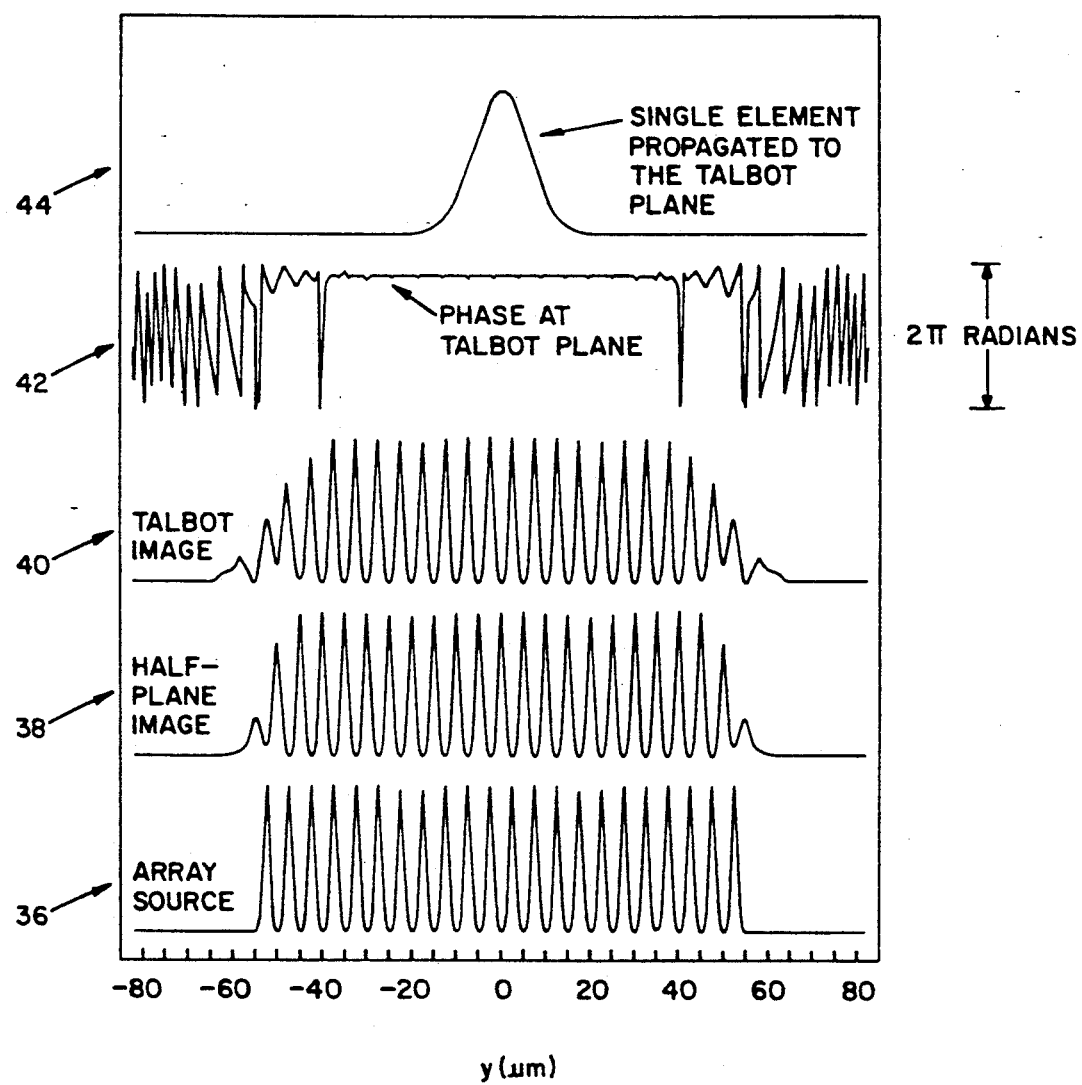

FIG. 3 is a graph indicating theoretical Talbot images at several planes across a free propagation region from a subarray of twenty-two (22) chirped grating surface emitting distributed feedback semiconductor laser devices. Also shown is a graph indicating a theoretical phase profile at the Talbot plane from the subarray and a theoretical intensity profile at the Talbot plane from a single chirped grating surface.

Figure 4:
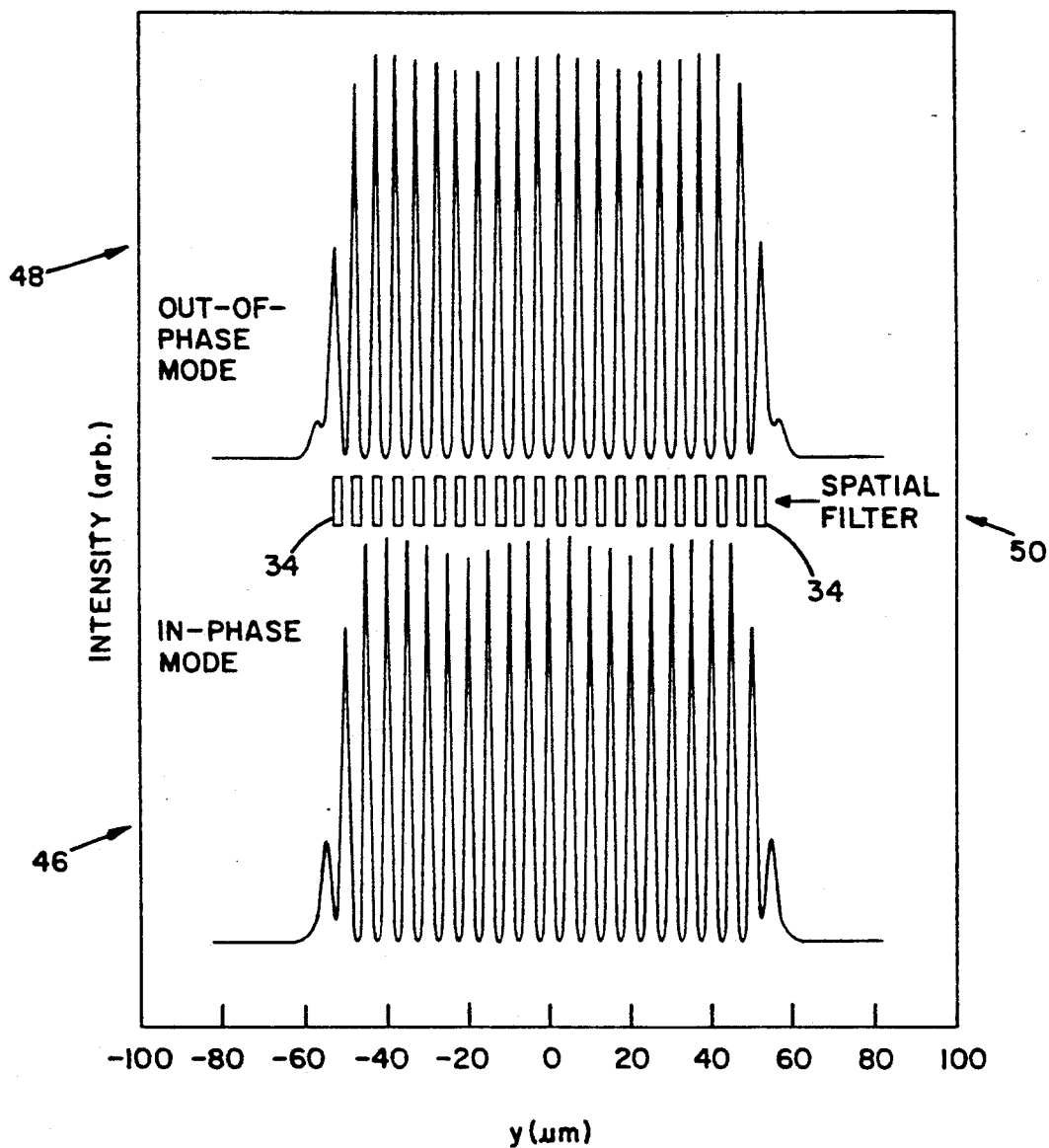

FIG. 4 is a graph indicating theoretical in-phase waveguide mode and out-of-phase waveguide mode half-plane Talbot images from a subarray.

Figure 5:
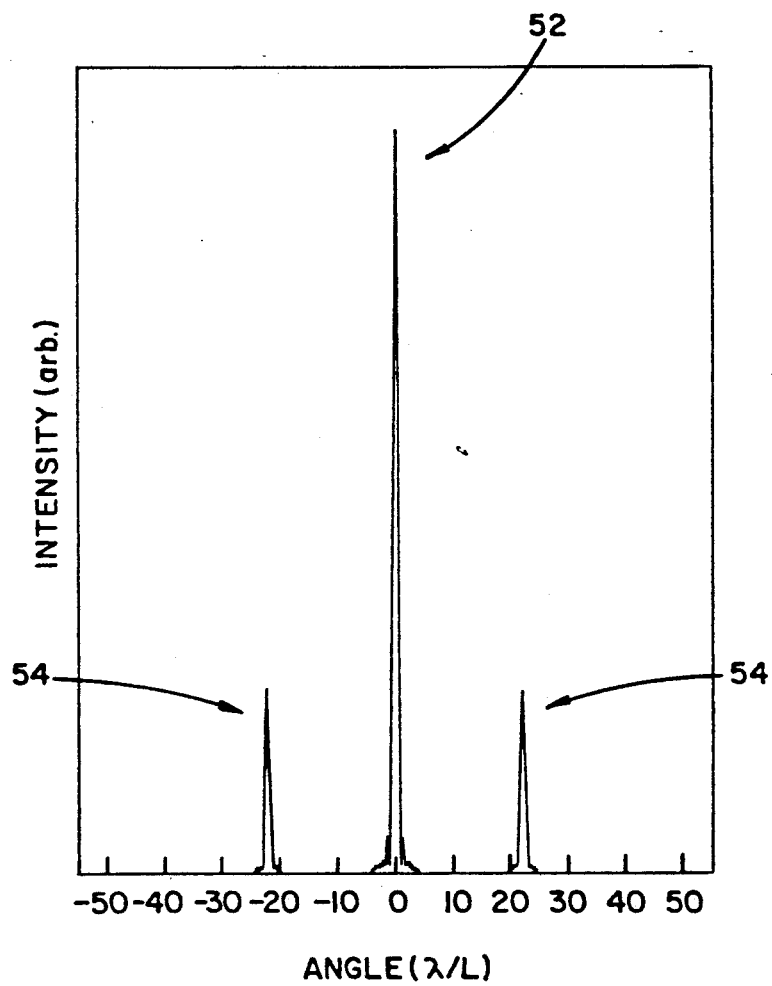

FIG. 5 is a graph indicating a theoretical longitudinal mode far-field intensity profile of a semiconductor laser array.

DETAILED DESCRIPTION OF THE PREFERRED EMBODIMENT

Figure 1A:
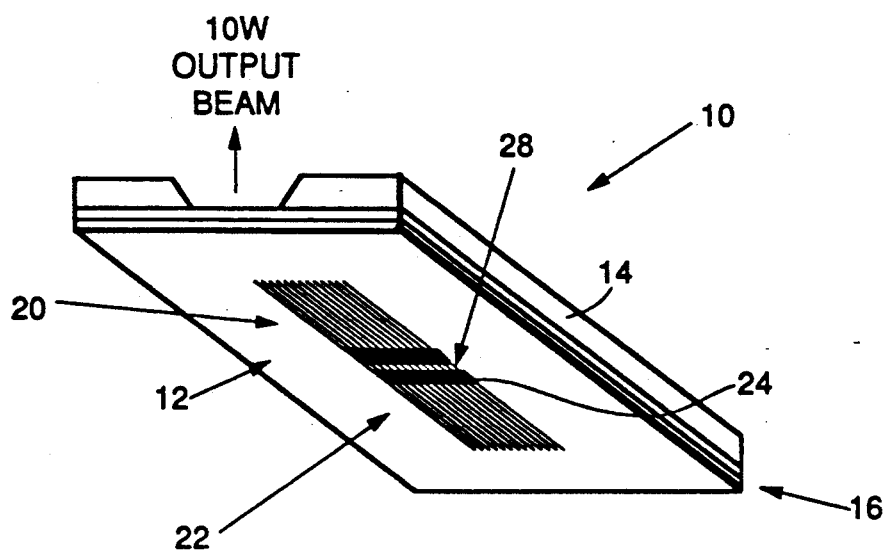
FIG. 1a is a three dimensional view of a present invention manufacture containing an array of chirped grating surface emitting distributed feedback semiconductor laser devices.

Referring to FIG. 1a, there is shown a three-dimensional bottom view of a present invention manufacture 10 containing a chirped grating surface emitting distributed feedback semiconductor laser device array 12. This manufacture 10 consists of a negatively (N) doped gallium and arsenic material compound (GaAs) substrate 14 upon which several epitaxial layers 16 are grown. The process for fabricating this manufacture 10 is similar to that described in the related and copending patent application and assigned to the assignee hereof, Ser. No. 07/822,253, entitled, Apparatus and Method for Fabricating a Chirped Grating in a Surface Emitting Distributed Feedback Semiconductor Laser Diode Device, filed on Jan. 17, 1992 except that instead of fabricating an array of isolated chirped grating surface emitting distributed feedback semiconductor laser devices, the present invention manufacture 10 is fabricated to include a chirped grating surface emitting distributed feedback semiconductor laser device array 12 that is arranged into a first subarray 20 and a second subarray 22 which are separated by a free propagation region 24 containing a performance enhancing Talbot spatial filter array 28. It should be noted that the present invention manufacture can be fabricated to include a chirped grating surface emitting distributed feedback semiconductor laser device array with more than two subarrays provided they are all separated from each other by free propagation regions containing performance enhancing Talbot spatial filter arrays.

Figure 1B:
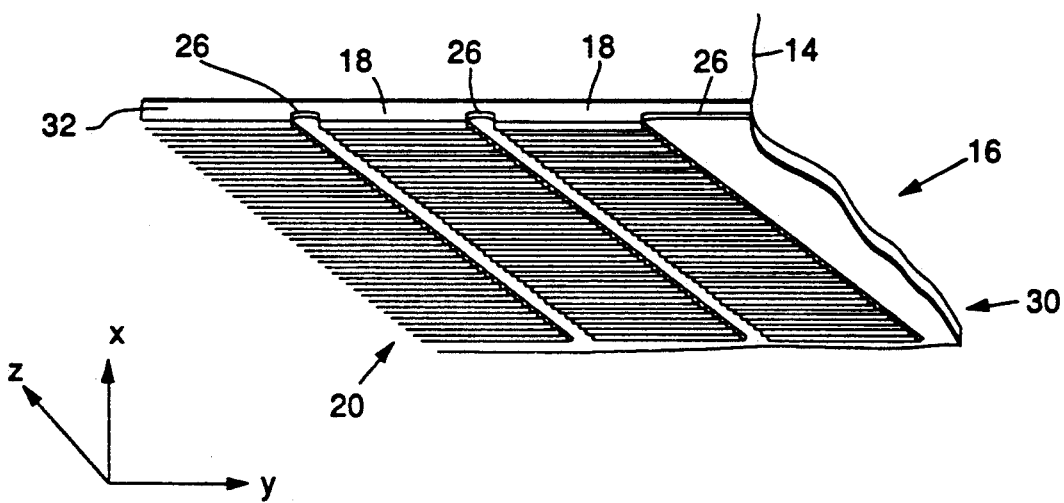
FIG. 1b is a three-dimensional, cross-sectional, cutaway view of the manufacture across a subarray of several of the chirped grating surface emitting distributed semiconductor laser devices.

As shown in the cutaway view in FIG. 1b, a subarray 20 consists of several parallel positioned chirped grating surface emitting distributed feedback semiconductor laser devices 18. The parallel positioned chirped grating surface emitting distributed feedback semiconductor laser devices 18, or elements, of a subarray 20 are laterally (along the Y-axis coordinate plane) isolated from each other by inter-element stripes 26 of an optical absorbing GaAs material. Thus, no lateral coupling will occur between the GaAs material stripes. It should be noted that a chirped grating surface 30 for the whole array 12 is etched into a bottom epitaxial layer 32 before an etch back and overgrowth process is performed to fabricate the optical absorbing GaAs material inter-element stripes 26. Thus, a consistent periodicity is insured for the chirped grating surface 30 across all of the array elements 18. It should also be noted that the chirped grating surface emitting distributed feedback semiconductor laser device array 12 is fabricated such that each element 18 in the first subarray 20 is directly in line with an element 18 in the second subarray 22, and vice versa, thereby promoting Talbot coupling between the two subarrays 20, 22. Each pair of in-line subarray elements 18 is referred to as a corresponding pair of subarray elements 18'.

Figure 2:
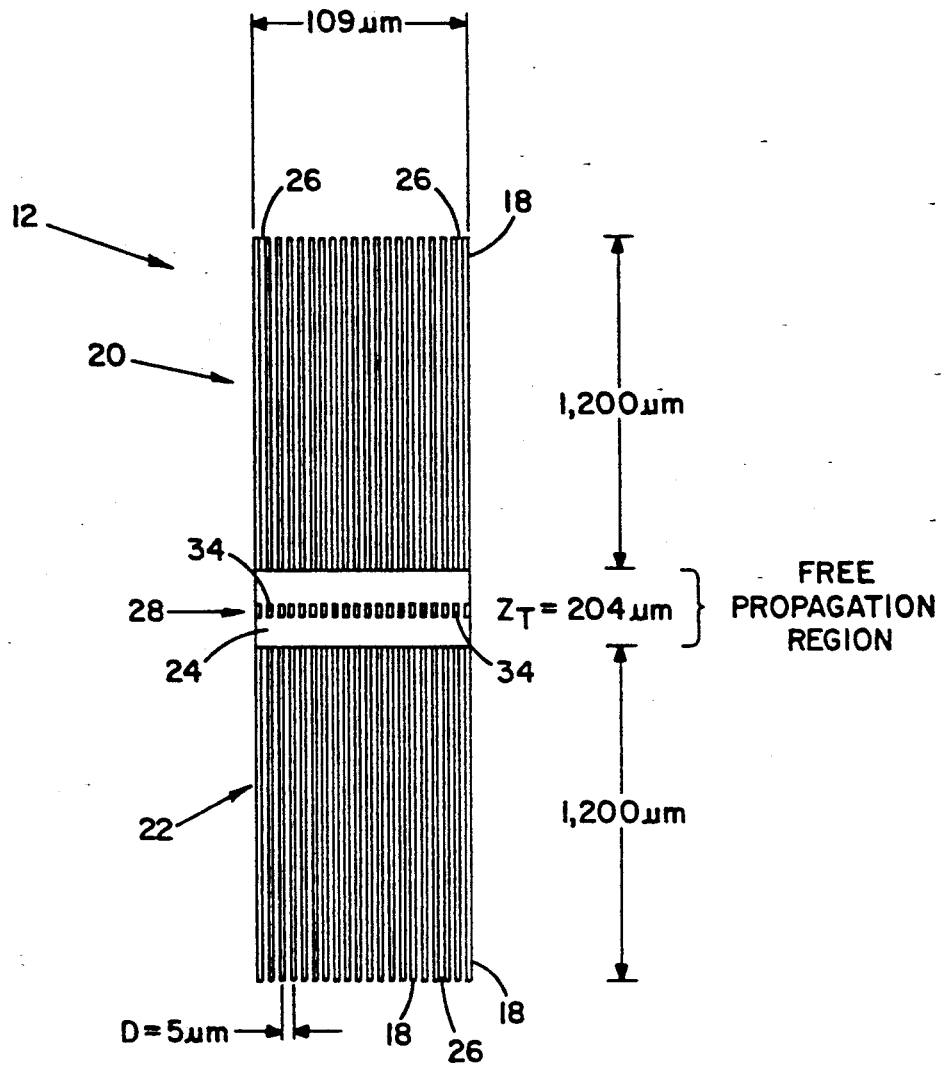
FIG. 2 is an illustration of two chirped grating surface emitting distributed feedback semiconductor laser device subarrays separated by a free propagation region containing a Talbot spatial filter array.

Referring to FIG. 2, there is shown an illustration of the chirped grating surface emitting distributed feedback semiconductor laser device array 12 of FIG. 1a. The subarrays 20, 22 are separated by the free propagation region 24 having a length (in the z-axis coordinate direction) equal to the Talbot distance. The Talbot distance is calculated according to the equation, $$z_T = \frac{2\bar{n}D^2}{\lambda},$$

where $\bar{n}$ is an effective index of refraction in the free propagation region, D is an on-center spacing of adjacent array elements, and $\lambda$ is a vacuum wavelength of all array element standing waves. For the array 12 shown in FIG. 2, the Talbot distance $z_T = 204$ μm for $D = 5.0$ μm, $\bar{n} = 3.47$, and $\lambda = 0.85$ μm.

Also shown in FIG. 2, is the Talbot spatial filter array 28. The Talbot spatial filter array 28 is comprised of several "islands" 34 of optical absorbing GaAs material that are positioned in the center of the free propagation region 24, or at one half the Talbot distance, $z_T$. These optical absorbing islands 34 are also positioned such that there is one island 34 directly in line with each corresponding pair of array elements 18'. The optical absorbing islands 34 are fabricated into the manufacture 10 during the same etch back and overgrowth process that is performed to fabricate the inter-element stripes 26.

Referring to FIG. 3, there is shown a graph indicating theoretical in-phase waveguide mode Talbot images from a single twenty-two (22) element subarray at the subarray source 36 ($z=0$), one half the Talbot distance from the subarray source 38 ($z=z_T/2$), and a full Talbot distance from the subarray source 40 ($z=z_T$). For purposes of this description, the single twenty-two (22) element subarray referred to above can be either the first subarray 20 or the second subarray 22 of the present invention manufacture 10. Also shown in FIG. 3, is a graph indicating a theoretical in-phase waveguide mode phase profile 42 from the single twenty-two (22) element subarray at the Talbot distance ($z=z_T$). Note that the Talbot image 40 at the full Talbot distance is well formed with respect to the subarray source image 36 and that the phase profile 42 is very flat over most of the Talbot image 40. Thus, since the theoretical Talbot intensity 40 and phase 42 profiles from the single subarray are indicated at the full Talbot distance, the distance by which the first 20 and the second 22 subarrays are separated in the present invention manufacture 10, it is seen that the strongest coupling between the first 20 and the second 22 subarrays occurs when the two subarrays 20, 22 are separated by the Talbot distance and the two subarrays 20, 22 are in-phase with one another.

To illustrate a degree of parallel coupling between elements 18 within a subarray 20, 22, a graph 44 indicating a theoretical wave propagation intensity at the Talbot distance from a single subarray element 18 is shown in FIG. 3. It is seen from this graph 44, that a single element 18 is parallel coupled to approximately four adjacent elements 18 at the Talbot distance. Although not apparent from this graph, it has been theoretically and practically proven, as described in an article entitled, *Coherent Operation of an Array of Diode Lasers Using a Spatial Filter in a Talbot Cavity*, Applied Physics Letters, Volume 50, Number 9, pages 816-818, 1988, that a high degree of parallel coupling between elements 18 within a subarray 20, 22 results in only an in-phase waveguide mode and an out-of-phase waveguide mode being well defined within a free propagation region 24. Thus, since the strongest coupling between the first 20 and the second 22 subarrays in the present invention manufacture 10 occurs when the subarrays 20, 22 are in phase, the out-of-phase waveguide mode must be filtered.

Referring to FIG. 4, there is shown a graph indicating the theoretical in-phase waveguide mode and out-of-phase waveguide mode Talbot images from a single twenty-two (22) element subarray at one half the Talbot distance from the subarray source ($z=z_T/2$). Also shown in FIG. 4, is a block representation of a single twenty-two (22) element Talbot spatial filter array 50 that, according to the present invention manufacture 10, is positioned at one half the Talbot distance from the subarray source such that there is one spatial filter island 34 directly in line with each subarray element 18. For purposes of this description, the single twenty-two (22) element subarray referred to above can be either the first subarray 20 or the second subarray 22 of the present invention manufacture 10.

It is seen from the graph in FIG. 4 that the in-phase waveguide mode Talbot images 46 have maximum intensity peaks centered between the Talbot spatial filter array islands 34. However, the out-of-phase waveguide mode Talbot images 48 have their maxima centered directly in line with the Talbot spatial filter array islands 34. Thus, the Talbot spatial filter array selectively filters the out-of-phase waveguide mode while transmitting the in-phase waveguide mode.

Referring to FIG. 5, there is shown a theoretical longitudinal mode far-field intensity profile of a Talbot filtered chirped grating surface emitting distributed feedback semiconductor laser array containing two (2) twenty-two (22) element subarrays. Although the majority of the power is directed into the central lobe 52, there are significant side lobes 54 that originate from a low fill factor which is required for parallel coupling. However, much of the energy in these side lobes 54 can be redirected into the central lobe 52, by using a single level binary-optic phase plate. Similar phase plates have been used in the past, as described in the *Coherent Operation of an Array Diode Lasers Using a Spatial Filter in a Talbot Cavity* article, with no significant loss of efficiency. The use of such a phase plate in the present invention manufacture 10 results in a Talbot filtered chirped grating surface emitting distributed feedback semiconductor laser array 12 that produces a high quality laser beam with up to 10 watts of continuous wave-power in the central far-field lobe 52.

It is thus seen that the objectives set forth above are efficiently obtained and, since certain changes may be made in the above described manufacture without departing from the scope of the invention, it is intended that all matter contained in the above description or shown in the accompanying drawings shall be interrupted as illustrative and not in a limiting sense.

What is claimed is:

1. In a manufacture having dielectric, metal, and semiconductor material layers, wherein an array of surface emitting distributed feedback semiconductor laser devices is fabricated into said manufacture, and wherein an output window is also fabricated into said manufacture, to allow an output laser beam produced from said array to exit said manufacture, an improvement comprising:
   a Talbot spatial filter array that is fabricated into said manufacture in a chirped grating arrangement so as to establish fundamental lateral mode oscillation between said surface emitting distributed feedback semiconductor laser devices in said array.

2. The manufacture as defined in claim 1, wherein said array of surface emitting distributed feedback semiconductor laser devices is comprised of a first subarray having a plurality of parallel positioned surface emitting distributed feedback semiconductor laser devices and a second subarray having a plurality of parallel positioned surface emitting distributed feedback semiconductor laser devices, wherein said first subarray and said second subarray are separated by a free propagation region, and wherein each of said plurality of surface emitting distributed feedback semiconductor laser devices, or elements, within said first subarray is directly in line across said free propagation region with a corresponding one of said plurality of surface emitting distributed feedback semiconductor laser devices, or elements, in said second subarray.

3. The manufacture as defined in claim 2, wherein each of said parallel positioned elements in said first subarray are laterally isolated from each other by inter-element optical absorbing material stripes, and wherein each of said parallel positioned elements in said second subarray are laterally isolated from each other by inter-element optical absorbing material stripes.

4. The manufacture as defined in claim 3, wherein said free propagation region separating said first subarray and said second subarray has a length equal to a Talbot distance, wherein said Talbot distance is expressed by an equation, $$z_T = \frac{2\bar{n}D^2}{\lambda},$$

wherein $\bar{n}$ is an effective index of refraction in said free propagation region, D is an on-center spacing between said parallel positioned subarray elements, $\lambda$ is a vacuum wavelength of a standing wave for all of said array elements, and z is a coordinate axis that is in line with all of said parallel positioned array elements.

5. The manufacture as defined in claim 4, wherein said Talbot spatial filter array is comprised of a plurality of optical absorbing material islands, wherein said plurality of optical absorbing material islands are fabricated into said manufacture throughout said free propagation region at one half said Talbot distance, and wherein each of said plurality of optical absorbing material islands is directly between and in line with one of said plurality of corresponding inter-subarray element pairs, such that there is one of said plurality of optical absorbing material islands directly between and in line with each of said plurality of corresponding inter-subarray element pairs.

6. The manufacture as defined in claim 5, wherein said optical absorbing inter-element stripes and said optical absorbing islands are fabricated with a negatively doped gallium and arsenic (GaAs) material compound.

7. The manufacture as defined in claim 6, wherein said array of surface emitting distributed feedback semiconductor laser devices is an array of chirped grating surface emitting distributed feedback semiconductor laser devices.

8. The manufacture as defined in claim 7, wherein said output laser beam produced from said Talbot filtered chirped grating surface emitting distributed feedback semiconductor laser array has a predominantly single-lobed longitudinal mode far-field.

9. The manufacture as defined in claim 8, wherein said predominantly single-lobed longitudinal mode far-field is a high quality laser beam with up to 10 watts of continuous wave power.

10. A Talbot filtered surface emitting distributed feedback semiconductor laser array comprising:
    a plurality of chirped grated surface emitting distributed feedback semiconductor laser device subarrays; and
    at least one Talbot spatial filter array, such that said at least one Talbot spatial filter array having a chirped grating arrangement for establishing fundamental lateral mode oscillation within and between said plurality of surface emitting distributed feedback semiconductor laser device subarrays.

11. The array as defined in claim 10, wherein said plurality of surface emitting distributed feedback semiconductor laser device subarrays is comprised of a first subarray having a plurality of parallel positioned surface emitting distributed feedback semiconductor laser devices and a second subarray having a plurality of parallel positioned surface emitting distributed feedback semiconductor laser devices.

12. The array as defined in claim 11, wherein said first subarray and said second subarray are separated by a free propagation region, and wherein each of said plurality of surface emitting distributed feedback semiconductor laser devices, or elements, within said first subarray is directly in line across said free propagation region with a corresponding one of said plurality of surface emitting distributed feedback semiconductor laser devices, or elements, in said second subarray.

13. The array as defined in claim 12, wherein each of said parallel positioned elements in said first subarray are laterally isolated from each other by inter-element optical absorbing material stripes, and wherein each of said parallel positioned elements in said second subarray are laterally isolated from each other by inter-element optical absorbing stripes.

14. The array as defined in claim 13, wherein said free propagation region separating said first subarray and said second subarray has a length equal to a Talbot distance, wherein said Talbot distance is expressed by an equation, $$z_T = \frac{2\bar{n}D^2}{\lambda},$$

wherein $\bar{n}$ is an effective index of refraction in said free propagation region, D is an on-center spacing between said parallel positioned subarray elements, $\lambda$ is a vacuum wavelength of a standing wave for all of said array elements, and z is a coordinate axis that is in line with all of said parallel positioned array elements.

15. The array as defined in claim 14, wherein said talbot spatial filter array is comprised of a plurality of optical absorbing material islands, wherein said plurality of optical absorbing material islands are positioned throughout said free propagation region at one half said talbot distance, and wherein each of said plurality of optical absorbing material islands is directly between and inline with one of said plurality of corresponding inter-subarray element pairs, such that there is one of said plurality of optical absorbing material islands directly between and inline with each of said plurality of corresponding inter-subarray element pairs.

16. The array as defined in claim 15, wherein said optical absorbing material in said optical absorbing inter-element stripes and said optical absorbing islands is a negatively doped gallium and arsenic (GaAs) material compound.

* * * * *